US010325653B2

(12) United States Patent
Hu et al.

(10) Patent No.: US 10,325,653 B2
(45) Date of Patent: *Jun. 18, 2019

(54) VARIABLE RESISTANCE MEMORY STACK WITH TREATED SIDEWALLS

(71) Applicant: Micron Technology, Inc., Boise, ID (US)

(72) Inventors: Yongjun Jeff Hu, Boise, ID (US); Tsz W. Chan, Boise, ID (US); Christopher W. Petz, Boise, ID (US); Everett Allen McTeer, Eagle, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/856,806

(22) Filed: Dec. 28, 2017

(65) Prior Publication Data

US 2018/0144795 A1  May 24, 2018

Related U.S. Application Data

(62) Division of application No. 14/266,456, filed on Apr. 30, 2014.

(51) Int. Cl.
*G11C 13/00* (2006.01)
*H01L 27/24* (2006.01)
*H01L 45/00* (2006.01)

(52) U.S. Cl.
CPC ...... *G11C 13/0004* (2013.01); *H01L 27/2409* (2013.01); *H01L 27/2463* (2013.01); *H01L 45/06* (2013.01); *H01L 45/1233* (2013.01); *H01L 45/1253* (2013.01); *H01L 45/141* (2013.01); *H01L 45/142* (2013.01); *H01L 45/143* (2013.01); *H01L 45/144* (2013.01); *H01L 45/145* (2013.01); *H01L 45/148* (2013.01); *H01L 45/1625* (2013.01); *H01L 45/1675* (2013.01); *G11C 2213/35* (2013.01);
(Continued)

(58) Field of Classification Search
CPC ............. H01L 45/1233; H01L 45/1253; H01L 45/141; H01L 45/1625; H01L 45/1675; H01L 27/2409; H01L 27/2427
See application file for complete search history.

(56) References Cited

U.S. PATENT DOCUMENTS 6,143,124 A  11/2000 Ahn
9,281,471 B2  3/2016 Hu et al.
(Continued)

OTHER PUBLICATIONS

Liu, Zheng, et al., "Ultrathin high-temperature oxidation-resistant coatings of hexagonal boron nitride", Nature Communications, 4(2541), (Oct. 4, 2013), 1-8.

*Primary Examiner* — Allison Bernstein
(74) *Attorney, Agent, or Firm* — Schwegman Lundberg & Woessner, P.A.

(57) ABSTRACT

Memory devices and methods for fabricating memory devices have been disclosed. One such method includes forming a memory stack out of a plurality of elements. A sidewall liner is formed on a sidewall of the memory stack using a physical vapor deposition (PVD) process, including an adhesion species and a dielectric, such that the adhesion species intermixes with an element of the memory stack to terminate unsatisfied atomic bonds of the element and the dielectric forms a dielectric film with the adhesive species on the sidewall.

20 Claims, 9 Drawing Sheets

(52) U.S. Cl.
CPC ...... *G11C 2213/52* (2013.01); *G11C 2213/71* (2013.01); *H01L 27/2481* (2013.01)

(56) References Cited

U.S. PATENT DOCUMENTS

| | | |
|---|---|---|
| 9,306,159 B2 | 4/2016 | Chan et al. |
| 9,673,256 B2 | 6/2017 | Hu et al. |
| 10,079,340 B2 * | 9/2018 | Chan ................ H01L 45/06 |
| 10,177,198 B2 | 1/2019 | Hu et al. |
| 2011/0049465 A1 * | 3/2011 | Nagashima ......... H01L 27/0207 257/5 |
| 2012/0224413 A1 | 9/2012 | Zhang et al. |
| 2012/0241705 A1 | 9/2012 | Bresolin et al. |
| 2013/0128649 A1 | 5/2013 | Quick et al. |
| 2015/0123066 A1 | 5/2015 | Gealy et al. |
| 2015/0318038 A1 | 11/2015 | Hu et al. |
| 2015/0318467 A1 | 11/2015 | Hu et al. |
| 2015/0318468 A1 | 11/2015 | Chan et al. |
| 2016/0190209 A1 | 6/2016 | Hu et al. |
| 2016/0218282 A1 | 7/2016 | Chan et al. |

\* cited by examiner

VARIABLE RESISTANCE MEMORY STACK WITH TREATED SIDEWALLS

PRIORITY APPLICATION

This application is a divisional of U.S. application Ser. No. 14/266,456, filed Apr. 30, 2014, which is incorporated herein by reference in its entirety.

BACKGROUND

Memory devices are typically provided as internal, semiconductor, integrated circuits in apparatuses such as computers or other electronic devices. There are many different types of memory including random-access memory (RAM), read only memory (ROM), dynamic random access memory (DRAM), synchronous dynamic random access memory (SDRAM), and non-volatile (e.g., phase change memory, flash) memory.

Non-volatile memories are important elements of integrated circuits due to their ability to maintain data absent a power supply. Phase change materials have been investigated for use in non-volatile memory cells. Phase change memory (PCM) elements include phase change materials, such as chalcogenide alloys, that are capable of stably transitioning between amorphous and crystalline phases. Each phase exhibits a particular resistance state and the resistance states distinguish the logic values of the memory element. Specifically, an amorphous state exhibits a relatively high resistance and a crystalline state exhibits a relatively low resistance. One of different logic levels (e.g., logic 1 or logic 0) can be assigned to each of these states.

There are general needs to improve PCM devices.

DETAILED DESCRIPTION

As described subsequently, a method for fabricating a memory stack (e.g., memory device) with treated sidewalls can increase the adhesion of dielectric passivation material to the electrodes. This can reduce inter-diffusion between the electrodes and adjacent materials in the memory stack.

Figure 1:
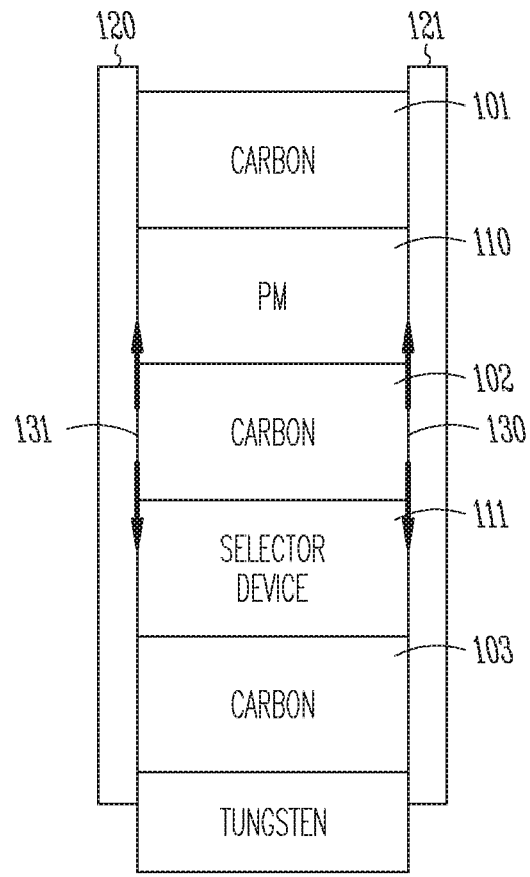
FIG. 1 illustrates a cross-sectional view of a typical phase change memory stack.

FIG. 1 illustrates a typical memory cell stack for a PCM. Carbon can be used as top 101, middle 102, and bottom 103 electrodes for the memory cell stack. Carbon is chemically inert and does not react easily with the phase change material 110 or the selector device material 111. This inert chemistry can also lead to poor adhesion of sidewalls to the carbon electrodes. As a result, it can be possible for the sidewall material 120, 121 to inter-diffuse 130, 131 between the selector device material 111 and the phase change material 110. This can occur at higher temperatures. The inter-diffusion can cause reliability issues, degrade leakage current, and affect threshold voltage stability.

FIGS. 2-7 illustrate various steps in fabricating a memory stack (e.g., phase change memory (PCM)) in addition to treating the sidewalls of the memory stack with an adhesion species. These fabrication steps are for purposes of illustration only as the different elements of the stack can be formed by different processes.

Figure 2:
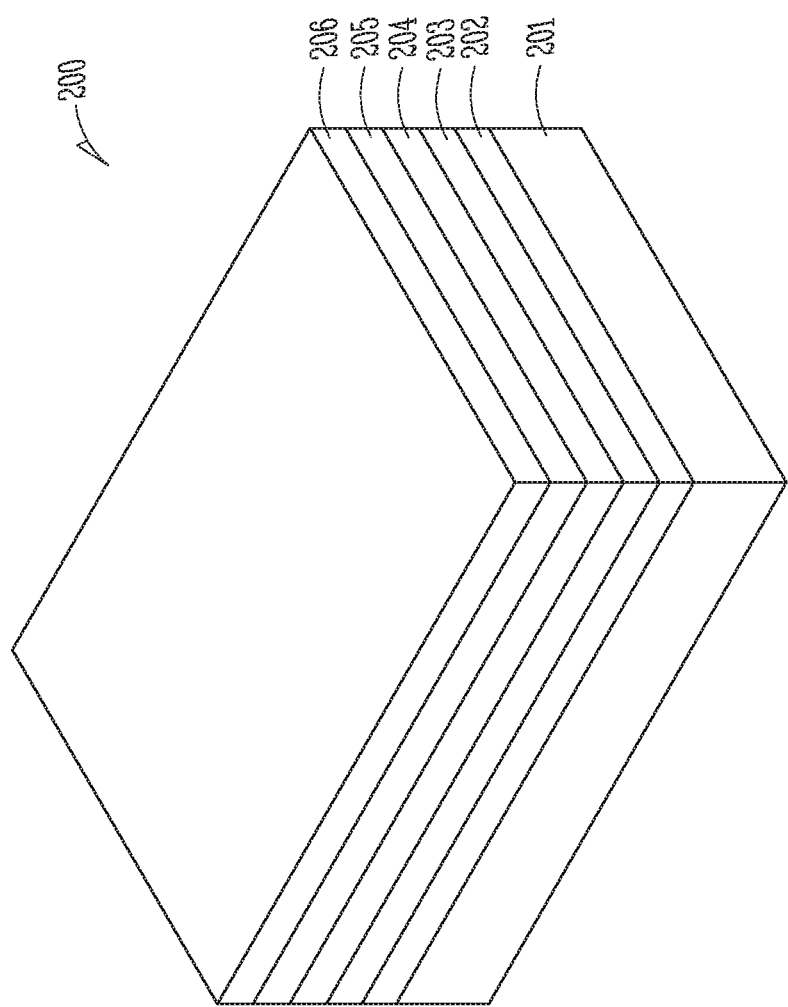
FIGS. 2-7 illustrate an embodiment of a process flow to fabricate a phase change memory stack having treated sidewalls.

FIG. 2 illustrates an embodiment of a blanket deposition of the initial memory stack material 200. The memory stack can include a word line material (e.g., tungsten (W)) 201. A first electrode material 202 (e.g., carbon) can be formed on the word line material 201. A selector device material 203 may be formed on the first electrode material 202.

The selector device material 203 (SD) may include Selenium (Se), Arsenic (As), Germanium (Ge), Tin (Sn), Tellurium (Te), Silicon (Si), Lead (Pb), Carbon (C), or Bismuth (Bi) as well as other materials. Other embodiments can include selector device material 203 comprising one or more of these elements as well as one or more of these elements combined with other elements.

A second electrode material 204 (e.g., carbon) can be formed on the selector device material 203. A phase change material 205 can be formed on the second electrode material 204.

The phase change material 205 (PM) can include chalcogenide elements such as Germanium (Ge), Antimony (Sb), Tellurium (Te), Indium (In) as well as other chalcogenide elements, combinations of these elements, or combinations of these elements with other elements. The phase change material 205 can additionally include Aluminum (Al), Gallium (Ga), Tin (Sn), Bismuth (Bi), Sulphur (S), Oxygen (O), Gold (Au), Palladium (Pd), Copper (Cu), Cobalt (Co), Silver (Ag), or Platinum (Pt) as well as other elements. Additional embodiments can combine these elements with the chalcogenide elements.

A third electrode material 206 (e.g., carbon) can be formed on the phase change material 205. Forming the third electrode material 206, as well as the other materials 201-205 of the memory stack, can be done with a blanket deposition method or some other deposition method.

Figure 3:
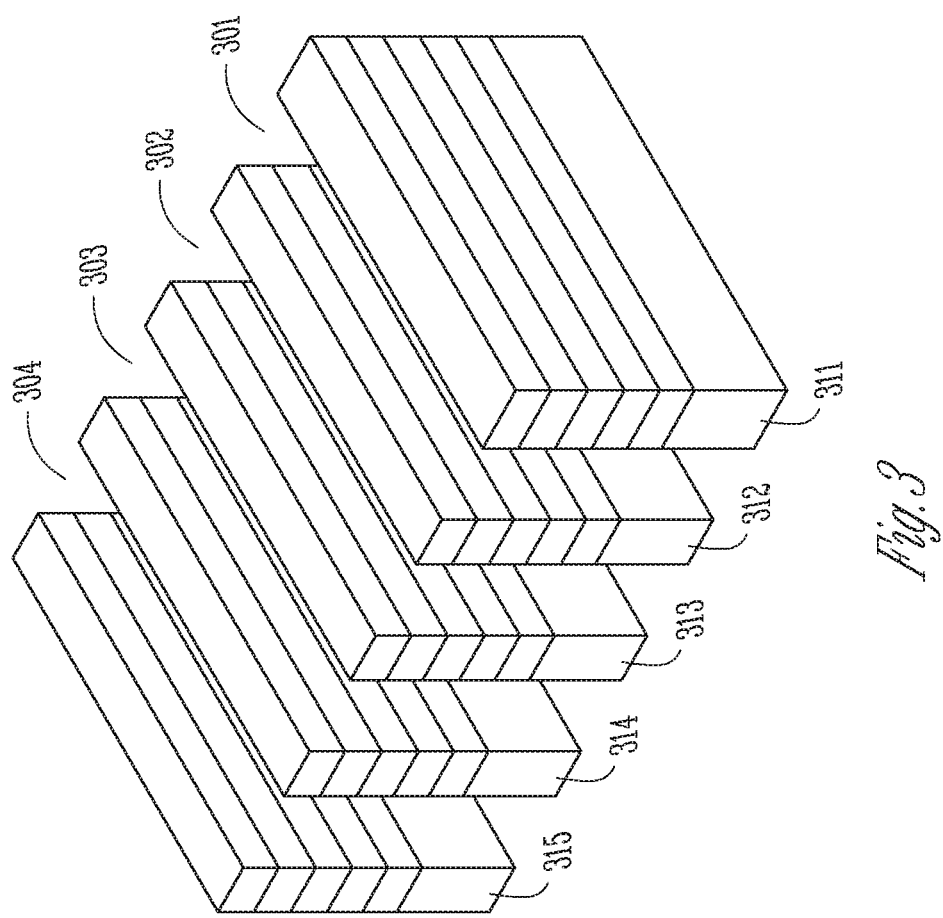

After the initial memory stack material 200 has been formed, an etch process (e.g., dry etch) can be performed on the stack material 200 to create trenches 301-304 as illustrated in FIG. 3. FIG. 3 illustrates that the stack material 200 has been divided by the plurality of trenches 301-304 into a plurality of memory stacks 311-315, each stack comprising the architecture illustrated in FIG. 2.

Figure 7:
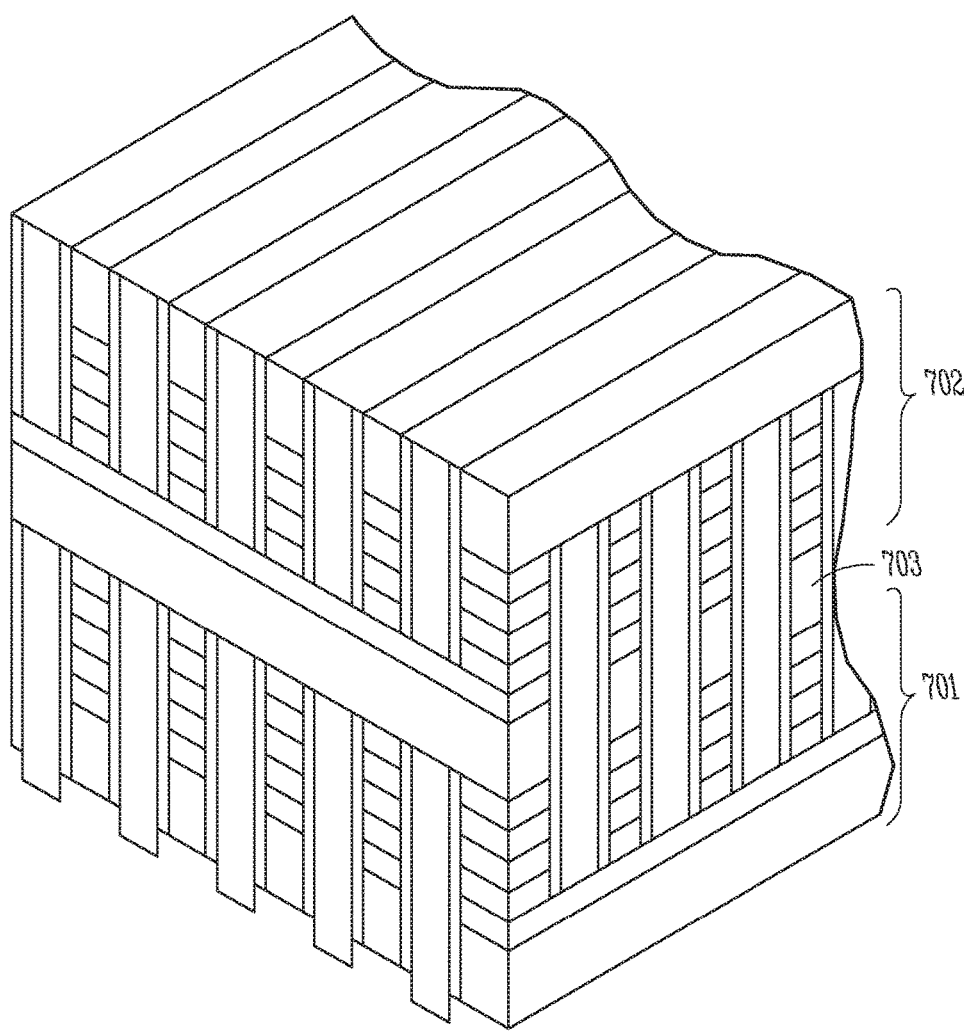

In another embodiment, the stack material 200 can be dry etched patterned in both x and y directions. Thus, subsequent sidewall liners can be added on four sidewalls, as illustrated in FIG. 7.

Figure 4:
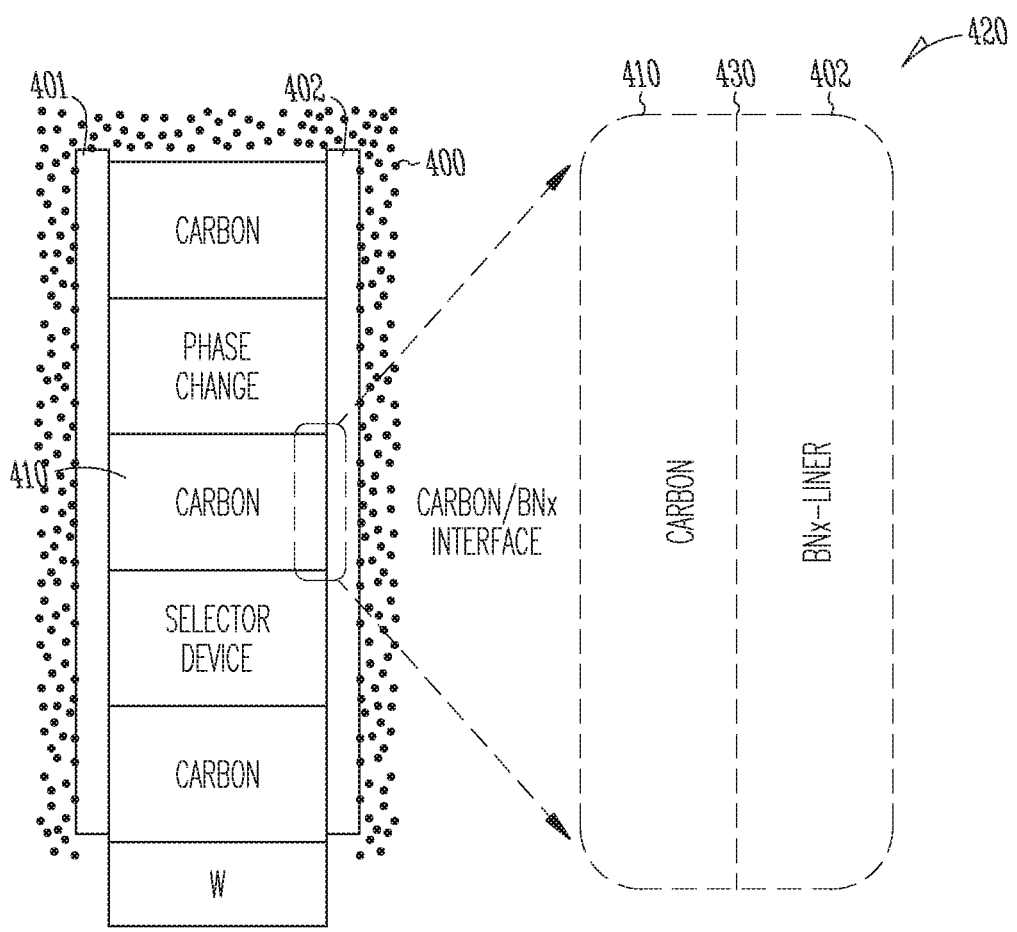
Figure 5:
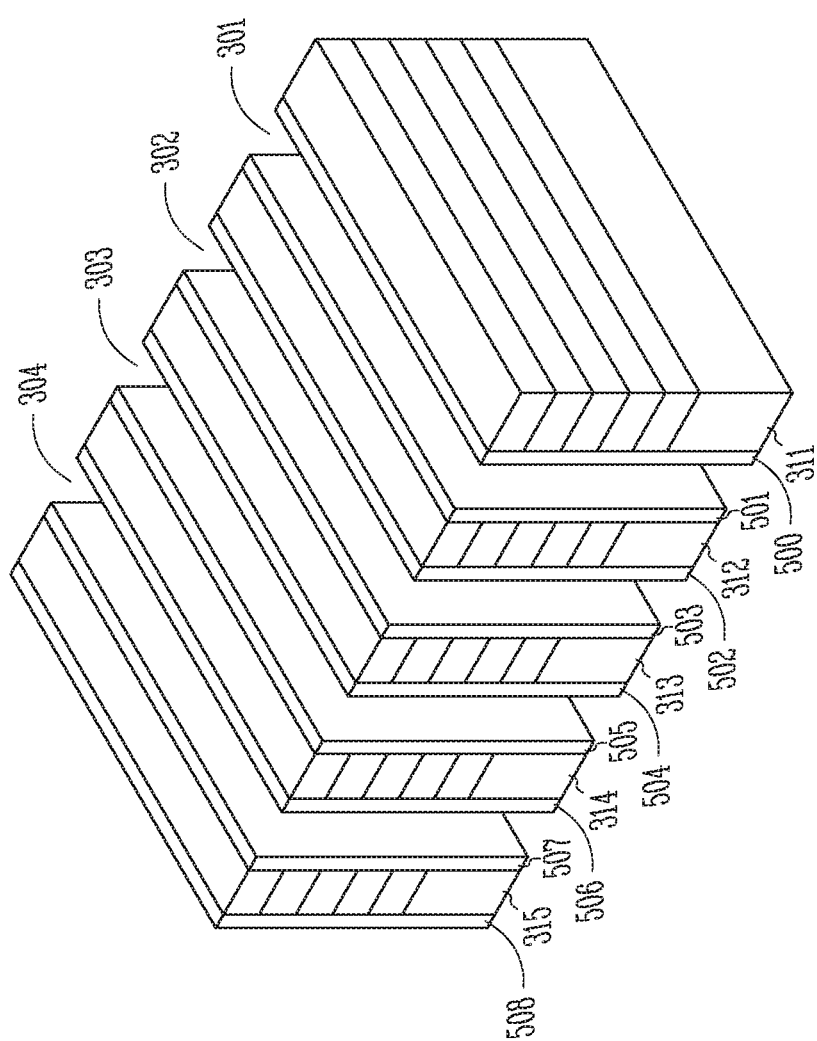

FIG. 4 illustrates the treatment of the sidewalls to form sidewall liners (as seen in FIG. 5) on the stacks 311-315 as formed in the embodiment illustrated in FIG. 3. A radio frequency (RF) physical vapor deposition (PVD) process, illustrated in greater detail in FIG. 8, can be used to form an adhesion species 401, 402 on the stack sidewalls. This treatment can enhance the dielectric liner adhesion to the electrode surfaces.

The stack sidewalls can be treated with the adhesion species 400 (e.g., boron) by exposing the sidewalls to the adhesion species and dielectric material (e.g., boron nitride ($BN_X$)) in a PVD chamber. Boron has properties that are between metals and non-metals. It is a semiconductor rather than a metallic conductor. Other adhesion species 401-403 that have substantially similar properties can also be used.

Figure 8:
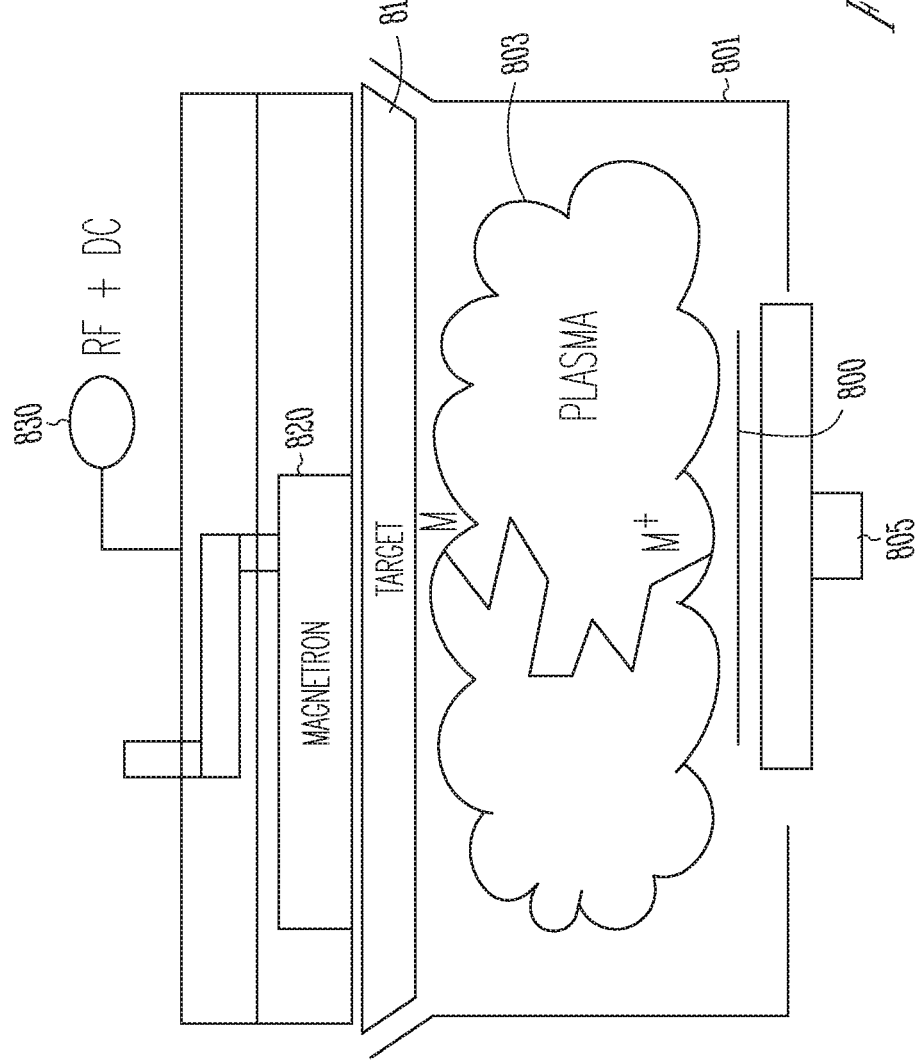
FIG. 8 illustrates an embodiment of a radio frequency physical vapor deposition process.

FIG. 8 illustrates an embodiment of an RF PVD process. The memory device 800 is placed in the PVD chamber 801 along with a target 810 of boron (B) or $BN_X$. A magnetron 820, using an RF source 830 (e.g., 1 kilowatt (kW) at 40 megahertz (MHz)) has a higher frequency as compared to a substrate bias 805 (e.g., 300 Watts, 13.56 MHz) of the memory device. The magnetron can also have a direct current (DC) power source. The PVD chamber can have a relatively high pressure (e.g., 50-150 milliTorr (mT)). The combination of relatively high pressure, relatively high RF frequency, and the substrate bias can result in increased scattering, increased ionization, increased re-sputtering that can result in a relatively dense/high aspect ratio structured sidewall 401, 402 as compared to other deposition processes.

If a target 810 of $BN_X$ is used, an argon (Ar) plasma 803 can be formed in the PVD chamber 801. If a target 810 of boron is used (e.g., reactively sputtered), a plasma 803 of $Ar+N_2$ gas mixture can be used. In such an embodiment, the adhesive species (e.g., boron) can be implanted at the electrode/liner interface 430 (see FIG. 4) and the dielectric material (e.g., $N_2$) can form a film with the adhesive species. While $BN_X$ is used for purposes of illustration, the present embodiments are not limited to any one adhesion species or dielectric material.

Referring to the more detailed view 420 of FIG. 4, the RF PVD process can form a sidewall liner 402 on one or more of the electrodes 410. The energetic nature of the PVD process can enhance sidewall liner adhesion with ion impingement. The C—B bonds 430 can create a stable, adhesive interface between the liner 402 and the electrode 410 when the adhesive species intermixes with an element of the electrode to terminate unsatisfied atomic bonds of the electrode. The PVD process can also provide a more controlled deposition process for form a relatively dense sidewall liner 402. While the detail 420 of FIG. 4 focuses on the second electrode 410, the present embodiments can perform substantially similar results on the other electrodes as well as other elements of the stack.

FIG. 5 illustrates the stacks 311-315 as a result of forming the sidewall liners 500-508 on the sidewalls of the stacks 311-315 as seen in FIGS. 4 and 8. The process to form the sidewall liners 500-508 can comprise any adhesive species or dielectric material. For purposes of illustration, a dielectric material like $AlSiO_x$ can be used.

Figure 6:
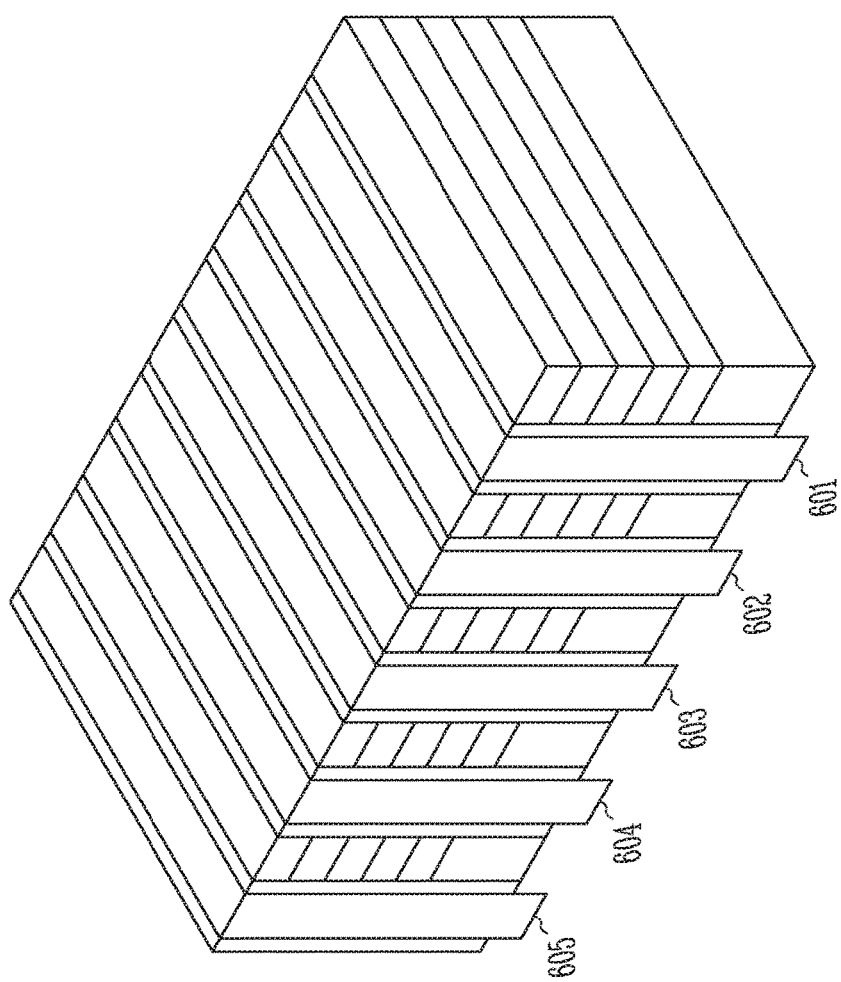

FIG. 6 illustrates an embodiment for forming a dielectric fill material 601-604 between adjacent memory stacks. The dielectric fill material 601-604 can electrically isolate each of the memory stacks. The dielectric fill material 601-604 can be the same material as the sidewall liners 500-508 or a different dielectric material.

FIG. 7 illustrates an embodiment for forming additional decks of memory stacks. For example, FIG. 7 shows two memory stacks 701, 702 coupled together at a common bit line 703. The sidewalls or the sidewall liner treatment described previously with reference to FIGS. 4 and 8 may be repeated for the memory stacks at each of the decks. Other embodiments can have additional decks of memory stacks 701, 702.

The represented sequence of layers is for purposes of illustration only. Other embodiments can use other sequences. For example, the relative position of the PM and select material (SD) may be exchanged. Also, the relative positions of word line material and bit line material may be changed (e.g., having bit lines at the bottom of the first deck and word lines at the top of the first deck and possibly shared with a second deck stack.

Figure 9:
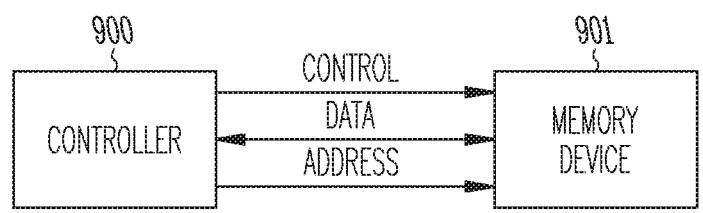
FIG. 9 illustrates a block diagram of a memory system in accordance with the embodiments of FIGS. 2-7.

FIG. 9 illustrates a block diagram of a memory system that include a memory device 901 that can use the memory stacks with treated sidewalls of FIGS. 2-7. A controller 900 may be used to control operations of the system. The memory device 901, coupled to the controller 900, may include a memory array comprising memory cell stacks as described above with reference to FIGS. 2-7.

The controller 900 may be coupled to the memory device 901 over control, data, and address buses. In another embodiment, the address and data buses may share a common input/output (I/O) bus. The controller 900 can be part of the same integrated circuit as the memory device 901 or as separate integrated circuits.

As used herein, an apparatus may refer to, for example, circuitry, an integrated circuit die, a memory device, a memory array, or a system including such a circuit, die, device or array.

CONCLUSION

One or more embodiments of the method for memory stack sidewall treatment can result in a memory device with memory stacks having enhanced adhesion between the sidewall liners and the memory stack. For example, an RF PVD process can be used to deposit a sidewall liner comprising an adhesion species and a dielectric material (e.g., $BN_X$). The adhesion species (e.g., boron) can form a bond (e.g., B—C) with an element (e.g., carbon) of the electrodes in order to create an enhanced adhesion between the sidewall liners and the memory stack. In such an embodiment, the adhesion species intermixes with an element of the memory stack to terminate unsatisfied atomic bonds of that element.

Although specific embodiments have been illustrated and described herein, it will be appreciated by those of ordinary skill in the art that any arrangement that is calculated to achieve the same purpose may be substituted for the specific embodiments shown. Many adaptations will be apparent to those of ordinary skill in the art. Accordingly, this application is intended to cover any adaptations or variations.

What is claimed is:

1. A memory system comprising:
a controller to control the system; and
a memory device, coupled to the controller, the memory device comprising:
a memory stack defined in part by sidewalls, comprising:
a first carbon electrode;
a selector device over the first carbon electrode;
a second carbon electrode over the selector device;
a phase change material over the second carbon electrode; and
a third carbon electrode over the phase change material; and
a sidewall liner material on sidewalls of the memory stack wherein the sidewall liner comprises a physical vapor deposited $BN_x$ such that the boron is configured to intermix with the carbon of the electrodes at an interface of the sidewall liner material and the sidewalls.

2. The memory system of claim 1, wherein the selector device comprises one or more of Selenium (Se), Arsenic (As), Germanium (Ge), Tin (Sn), Tellurium (Te), Silicon (Si), Lead (Pb), Carbon (C), and/or Bismuth (Bi).

3. The memory system of claim 1, wherein the phase change material comprises one or more of Germanium (Ge), Antimony (Sb), Tellurium (Te), Indium (In), Aluminum (Al), Gallium (Ga), Tin (Sn), Bismuth (Bi), Sulphur (S), Oxygen (O), Gold (Au), Palladium (Pd), Copper (Cu), Cobalt (Co), Silver (Ag), and/or Platinum (Pt).

4. The memory system of claim 1, further comprising a word line coupled to the first carbon electrode.

5. The memory system of claim 4, wherein the memory device comprises multiple memory stacks.

6. The memory system of claim 5, wherein the multiple memory stacks include memory stacks in multiple vertically arranged decks of memory stacks.

7. The memory system of claim 5, further comprising a dielectric fill material between first and second memory stacks of the multiple memory stacks.

8. The memory system of claim 6, wherein a first memory stack in a first deck and a second memory stack in a second vertically arranged deck are coupled to a common bit line extending between the first and second decks.

9. The memory system of claim 5, wherein a first memory stack in a first deck and a second memory stack in a second vertically arranged deck are coupled to a common word line extending between the first and second decks.

10. The memory system of claim 1, wherein the controller is coupled to the memory device over one or more buses communicating control, address, and data signals.

11. The memory system of claim 1, wherein the controller is a separate integrated circuit from the memory device.

12. A memory system, comprising:
a controller to control the system; and
a memory device, coupled to the controller, the memory device comprising:
multiple memory stacks defined in part by a respective sidewalls, such memory stacks each comprising:
a first electrode;
a selector device over the first electrode;
a second electrode over the selector device;
a variable resistance material over the second electrode; and
a third electrode over the variable resistance material;
wherein at least one of the first, second, and third electrodes comprises carbon; and
a sidewall liner material on sidewalls of the multiple memory stacks wherein the sidewall liner comprises an adhesion species;
wherein the sidewall liner material is formed by a radio frequency physical vapor deposition (RF PVD) process, such that the adhesion species is configured to intermix with the carbon of the one or more electrodes at an interface of the sidewall liner material and the sidewall of the respective memory stack.

13. The memory system of claim 12, wherein the sidewall liner material further comprises a dielectric material.

14. The memory system of claim 12, wherein the adhesion species comprises boron.

15. The memory system of claim 14, wherein the sidewall liner material comprises boron nitride ($BN_x$).

16. The memory system of claim 15, wherein the RF PVD process is performed in a PVD chamber utilizing a boron nitride ($BN_x$) target.

17. The memory system of claim 16, wherein a plasma of a gas comprising argon is formed in the PVD chamber.

18. The memory system of claim 12, wherein each of the first, second, and third electrodes is formed of carbon.

19. The memory system of claim 12, wherein the variable resistance material is a phase change material, and wherein the phase change material comprises one or more of Germanium (Ge), Antimony (Sb), Tellurium (Te), Indium (In), Aluminum (Al), Gallium (Ga), Tin (Sn), Bismuth (Bi), Sulphur (S), Oxygen (O), Gold (Au), Palladium (Pd), Copper (Cu), Cobalt (Co), Silver (Ag), and/or Platinum (Pt).

20. The memory system of claim 12, wherein the selector device comprises one or more of Selenium (Se), Arsenic (As), Germanium (Ge), Tin (Sn), Tellurium (Te), Silicon (Si), Lead (Pb), Carbon (C), and/or Bismuth (Bi).

* * * * *